United States Patent
Courcy et al.

(10) Patent No.: US 9,118,346 B2
(45) Date of Patent: Aug. 25, 2015

(54) COMPLEMENTARY SWITCHES IN CURRENT SWITCHING DIGITAL TO ANALOG CONVERTERS

(71) Applicant: ANALOG DEVICES, INC., Norwood, MA (US)

(72) Inventors: Matthew Louis Courcy, Fremont, NH (US); Martin Clara, Newton, MA (US); Gabriele Manganaro, Winchester, MA (US); Gil Engel, Lexington, MA (US); Lawrence A. Singer, Wenham, MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 14/135,198

(22) Filed: Dec. 19, 2013

(65) Prior Publication Data
US 2015/0180501 A1    Jun. 25, 2015

(51) Int. Cl.
*H03M 1/66* (2006.01)
*H03M 1/74* (2006.01)

(52) U.S. Cl.
CPC .............. *H03M 1/747* (2013.01); *H03M 1/66* (2013.01); *H03M 1/742* (2013.01)

(58) Field of Classification Search
CPC ........ H03M 1/747; H03M 1/742; H03M 1/66
USPC ......................................................... 341/144
See application file for complete search history.

(56) References Cited

U.S. PATENT DOCUMENTS

| | | | |
|---|---|---|---|
| 4,405,916 A | 9/1983 | Hornak et al. | |
| 5,767,699 A * | 6/1998 | Bosnyak et al. | 326/86 |
| 6,339,391 B1 * | 1/2002 | Chung et al. | 341/153 |
| 7,071,858 B2 * | 7/2006 | Pan | 341/133 |
| 7,369,077 B2 * | 5/2008 | Carroll | 341/153 |

OTHER PUBLICATIONS

Extended European Search Report in EP14191331 mailed Apr. 24, 2015, 9 pages.
Sagun, Wilfredo T. et al., "A 125-MHz 12-Bit Digital-to-Analog Converter System," 1266 Hewlett-Packard Journal 39, No. 2, Apr. 1, 1988, No. 2, Palo Alto, CA, US, 8 pages.

* cited by examiner

*Primary Examiner* — Brian Young
(74) *Attorney, Agent, or Firm* — Patent Capital Group

(57) ABSTRACT

The present disclosure provides embodiments of an improved current steering switching element for use in a digital to analog (DAC) converter. Typically, each current steering switching element in the DAC converter provides a varying set of currents for converting a digital input signal. Generally, the switches and drivers in the current steering switching elements are scaled down proportionally to the current being provided by the current steering switching element according to a ratio as less and less current is being driven by the switching element in order to overcome timing errors. However, device sizes are limited by the production process. When a switch is not scaled proportionally to the current, settling timing errors are present and affects the performance of the DAC. The improved current steering switching element alleviates this issue of timing errors by replacing the single switch with two complementary current steering switches.

27 Claims, 9 Drawing Sheets

US 9,118,346 B2

COMPLEMENTARY SWITCHES IN CURRENT SWITCHING DIGITAL TO ANALOG CONVERTERS

TECHNICAL FIELD OF THE DISCLOSURE

The present disclosure relates generally to digital to analog converters and, more particularly, to the digital to analog converters having current steering switches.

BACKGROUND

Present day digital circuit applications are becoming increasing sophisticated as the range of applications for these circuits increases. One important component for modern electronics is a digital to analog converter (DAC). When signals are processed in the digital domain, the signal is often converted to the analog domain, e.g., for transmission. Many architectures exists for DACs, including delta-sigma DACs, R-2R DACs, String DACs, and current steering DACs. These architectures have varying advantages and disadvantages. For high-speed or high converter/sample rate applications, current steering DACs tend to work the best among the different architectures, while delta-sigma DACs tend to work the best for applications requiring a high resolution.

Digital to analog converters (DACs), especially high-speed current steering DACs, have been moving to higher and higher sample rates as companies push to achieve high instantaneous bandwidth. The requirement of instantaneous bandwidth comes with the additional requirement that dynamic performance should not be sacrificed relative to existing lower bandwidth, lower frequency solutions.

OVERVIEW

The present disclosure provides embodiments of an improved current steering switching element for use in a digital to analog (DAC) converter. Typically, each current steering switching element in the DAC converter provides a varying set of currents for converting a digital signal. Generally, the switches and drivers in the current steering switching elements are scaled down proportionally to the current being provided by the current steering switching element according to a ratio as less and less current is being driven by the switching element in order to overcome timing errors. However, device sizes are limited by the production process. When a switch is not scaled proportionally to the current, settling timing errors are present and affects the performance of the DAC. The improved current steering switching element alleviates this issue of timing errors by replacing the single switch with two complementary current steering switches.

DESCRIPTION OF EXAMPLE EMBODIMENTS OF THE DISCLOSURE

Real-world analog signals such as temperature, pressure, sound, or images are routinely converted to a digital representation that can be easily processed in modern digital systems. In many systems, this digital information must be converted back to an analog form to perform some real-world function. The circuits that perform this step are digital-to-analog converters (DACs), and their outputs are used to drive a variety of devices. Loudspeakers, video displays, motors, mechanical servos, radio frequency (RF) transmitters, and temperature controls are just a few diverse examples. DACs are often incorporated into digital systems in which real-world signals are digitized by analog- to-digital converters (ADCs), processed, and then converted back to analog form by DACs. In these systems, the performance required of the DACs will be influenced by the capabilities and requirements of the other components in the system. A DAC generally produces a quantized (discrete step) analog output in response to a digital input code (e.g., a binary digital input code).

Current mode digital to analog converters typically operate by converting a digital input signal, e.g., a X-bit digital input signal, into a current which is an analog representation of the digital input signal. One exemplary way of providing the current output representative of the digital input signal is by providing and distributing bits or parts of the digital signal to an array of binary weighted switches (typically one switch per bit), each providing an appropriate (binary weighted) current output based on the bit of the digital input signal. From the most significant bit to the least significant bit, the switches successively provide less current. An X-bit DAC of this type consists of X weighted current sources (which may simply be resistors and a voltage reference) where the switch size corresponding to the most significant bit (MSB) is weighted by a factor of 1, and the least significant bit (LSB) switch size is weighted by a factor of $\frac{1}{2}^{X-1}$). The theory is simple but the practical problems of manufacturing an integrated circuit of an economical size with current switch size or resistor ratios of even 128:1 for an 8-bit DAC are significant, especially as they must have matched temperature coefficients. This issue of scaling exists not only for binary weighted switches, but for other architectures as well where a set of different currents are to be provided for converting a digital input signal into an analog output signal.

Figure 1:
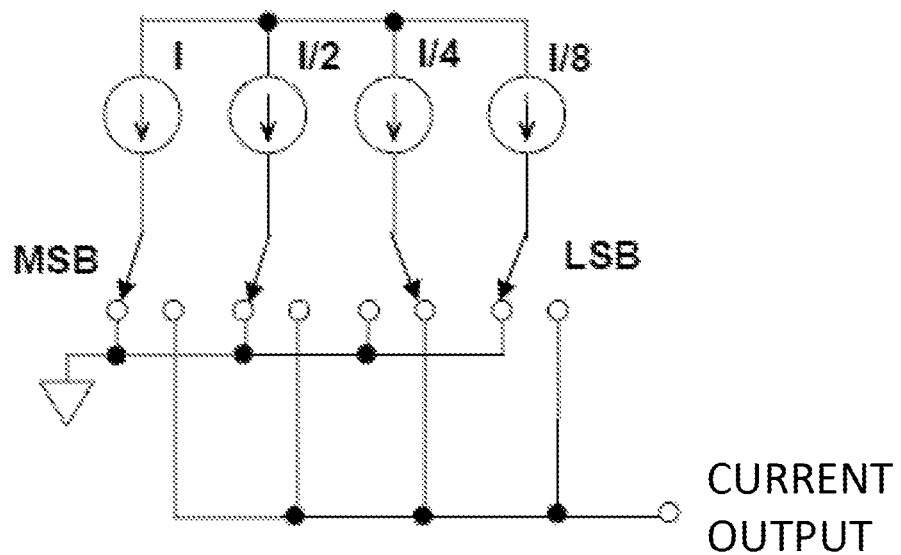
FIG. 1 is a simplified schematic diagram illustrating an exemplary architecture of a current steering DAC, according to an embodiment of the disclosure.

FIG. 1 is a simplified schematic diagram illustrating an exemplary architecture of a current steering DAC, according to an embodiment of the disclosure. For illustration, the current steering DAC shown in FIG. 1 is configured to convert a four-bit digital input signal using an array of four binary weighted switches. The switching mechanism enables currents I, I/2, I/4, and I/8 (weighted to the binary digital input) to be provided to a current combination network. The sum/ aggregation of the currents provided by the switches forms the analog representation of the digital input signal in the form of a current output.

Other architectures may utilize current steering switches weighted according to a particular set of weights (not necessary a set of binary weights) for generating the current output. The chosen set of weights for the design depend on the desired current output and application. In some architectures, the architecture is segmented where multiple sub-DACs are used to handle different sets of bits or parts of the digital input signal. It is noted that binary weighted current steering switches is merely one possible architecture and is provided herein simply as an illustration. Other suitable architectures are envisioned by the disclosure.

Scaling of Current Steering Switches

Current steering DACs are usually composed of an array of switches which switch currents from one side of a differential path to another. These switches carry currents with varying weights to provide the step sizes necessary to achieve the desired resolution of the converter. In addition, each switch is preferably driven by some digital driving cell. The elements of the array of switches is desirably all switch at the same time and waveforms from each is preferably identical so that differences between switches will not lead to wideband harmonic distortion components. To minimize this distortion mechanism, the switches must not only route their currents to one of two outputs, but the currents must settle identically from switch to switch regardless of the amount of current running through each switch. In order to achieve this goal, switch sizes and parasitics are typically scaled directly or proportionally with the amount of current in each switch according to a (fixed) ratio. The ratio is typically set by a larger switch (or the largest switch in the array of current steering switches), where the ratio is the scaling relationship between the size of the larger switch (i.e., width/length of the transistor used in the larger/largest switch) and the current being steered by that larger switch. Switch drivers would also be scaled proportionally so as not to introduce a loading dependent timing error. Within the context of this disclosure, a current steering switch having a switch and/or switch driver that is scaled proportionally to the amount of current for the switch according to the ratio is referred to a "scaled switch". A current steering switch and/or a switch driver that is not scaled proportionally to the amount of current for the switch (i.e., not according to the ratio) is referred to as an "unscaled switch". For these unsca led switches, the switch size is typically too big (relative to the ratio of the scaled switches) for the current being steered by the unscaled switch. This issue of unscaled switches occur when limitations in the manufacturing processes do not allow the size of switches to be made smaller.

Within the context of the disclosure, the "most significant bit" (MSB) refers to the bit in the highest bit position (having the biggest place value), and the "least significant bit" (LSB) refers to the bit in the lowest bit position (having the lowest place value). The "most significant bits" refer to a collection of bits in the higher bit positions when compared to the "least significant bits" in the lower bit positions.

Figure 2A:
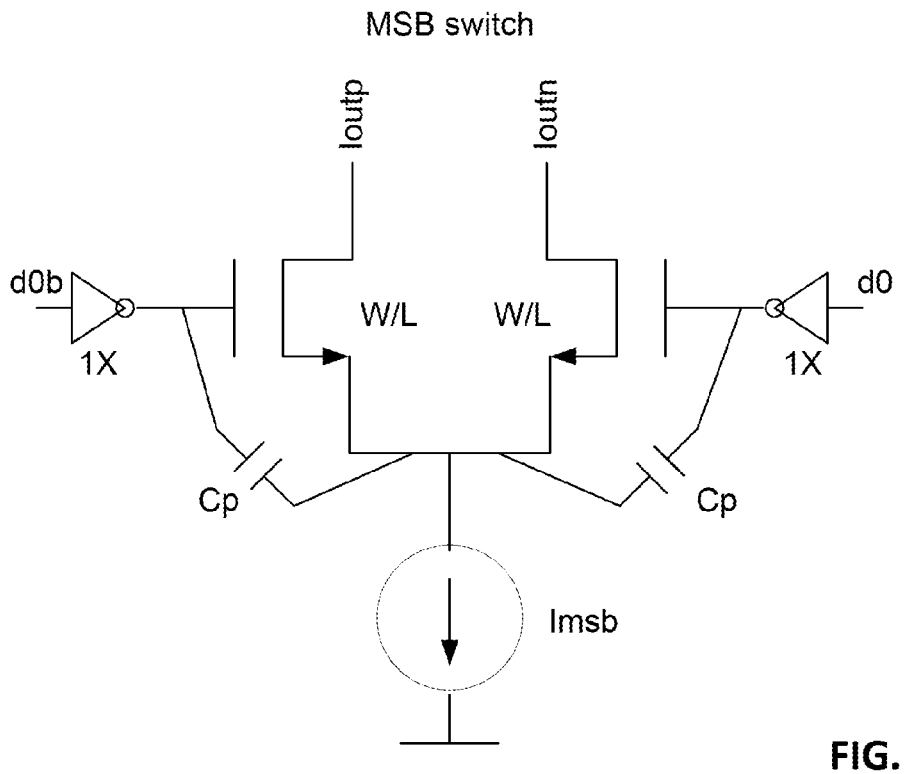
FIGS. 2A-B show scaled current steering switches.
Figure 2B:
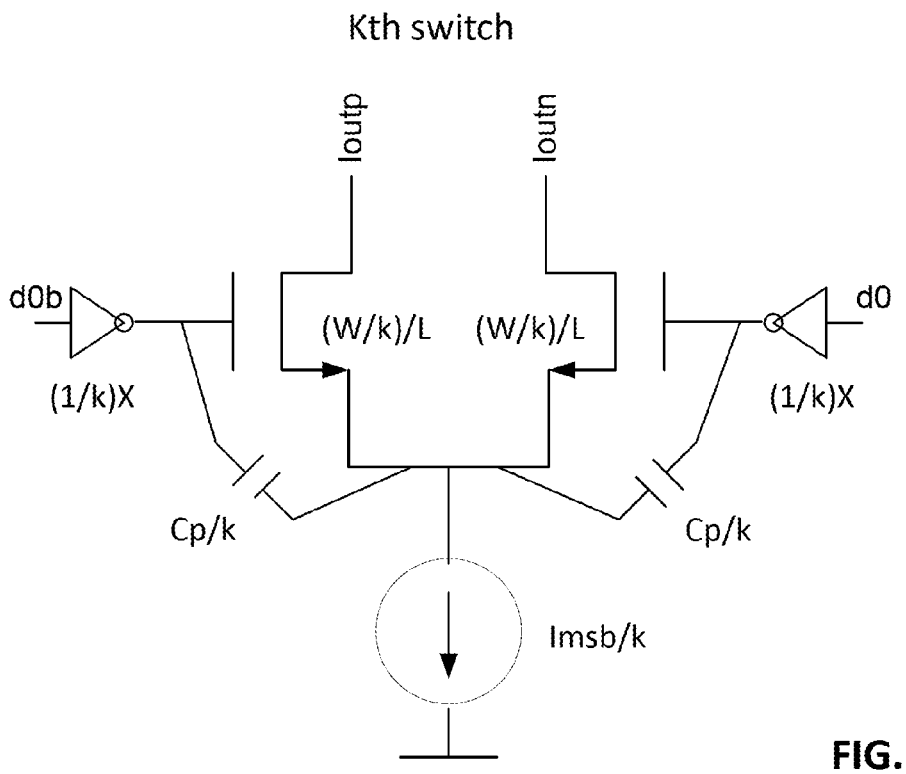

FIGS. 2A-B show scaled current steering switches. These switches are generally configured to route the respective current to Ioutp if d0 is high, and route the respective current to Ioutn if d0b is high. d0 is a bit of the digital input signal, and d0b is the inverse of d0. Scaling is achieved by sizing switches and drivers in the integrated circuit or chip successively smaller as the current being driven by the switch becomes smaller. In FIG. 2A, the MSB switch, or a switching element for carrying the largest amount of current Imsb, consequently has the largest size. The switch (i.e., the transistor) has a size W/L; the switch driver has a size of 1X; the parasitics has size of Cp. This switch typically sets the ratio between the size of the switch and the current provided by the switch for scaling down the switches as the current also goes down.

As currents are changed for other switches in the array, the current, switch size, and driver size change accordingly, where the switches are scaled down as the current being provided by the switch goes down according the ratio set by the MSB switch. Scaling leads to constant current density across all switches in the array and ensures that each current will charge its corresponding switch/parasitic capacitance in the same amount of time. Scaling of the driver makes sure the charging starts at the same time for each switch. In FIG. 2B, the Kth switch is also scaled according to the current provided by the switch Imsb/k. The switch (i.e., the transistor) has a size (W/k)/L; the switch driver has a size (1/k)X; the parasitics has a size of Cp/k. k is any positive real number. The value for k is selected based on the application and architecture such that the switch drives a desired amount of current.

Scaling Breaks

Due to the fact that the switches must be made very small as the current desired for the switch gets smaller in order to achieve the highest speed, it is physically impossible to scale a high resolution DAC all the way down to its smallest current source. Consider a high speed DAC is built in such a way that half of its full scale current runs through switches which have an effective size of 1024 um/0.08 um. In order to scale the current of the switch all the way to the LSB, 1024 um must be divided by $2^{15}$ or 32768. The device would be 0.03 μm/0.08 μm which is not only physically impossible in the process, but there is no practical way to scale the parasitics to this level. Scaling can only take place to a limit where a switch device can no longer practically get any smaller. Beyond this point, the size scaling stops but the current scaling continues. This is what is called a "break" in the scaling. At the point at which the scaling "breaks", the current density begins to drop off along with the charging capability of the switch.

Figure 3A:
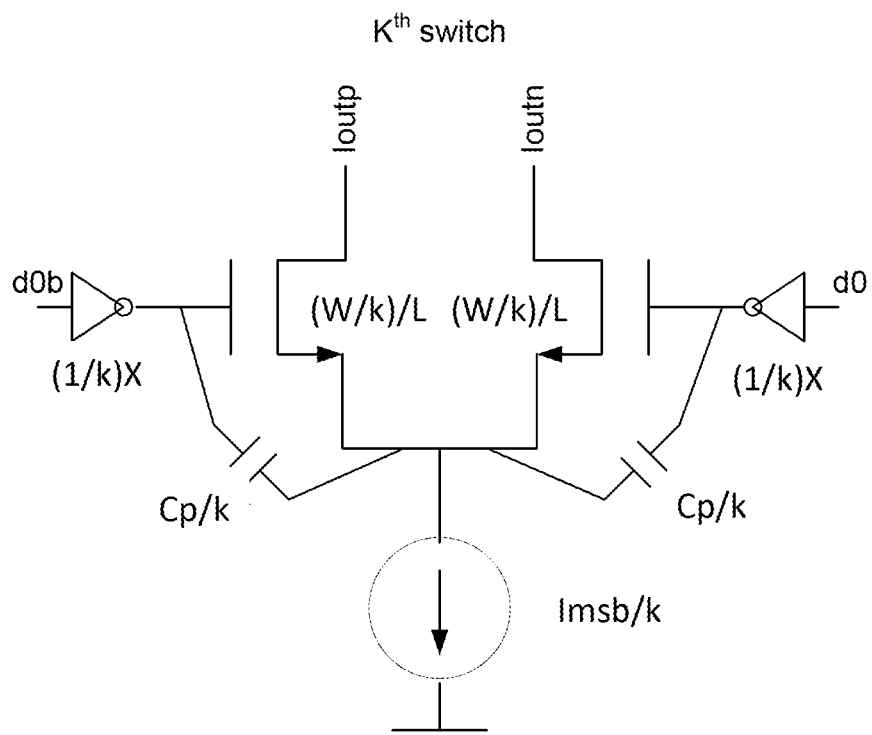
FIG. 3A-B show scaled and unscaled current steering switches illustrating a "break" In scaling.
Figure 3B:
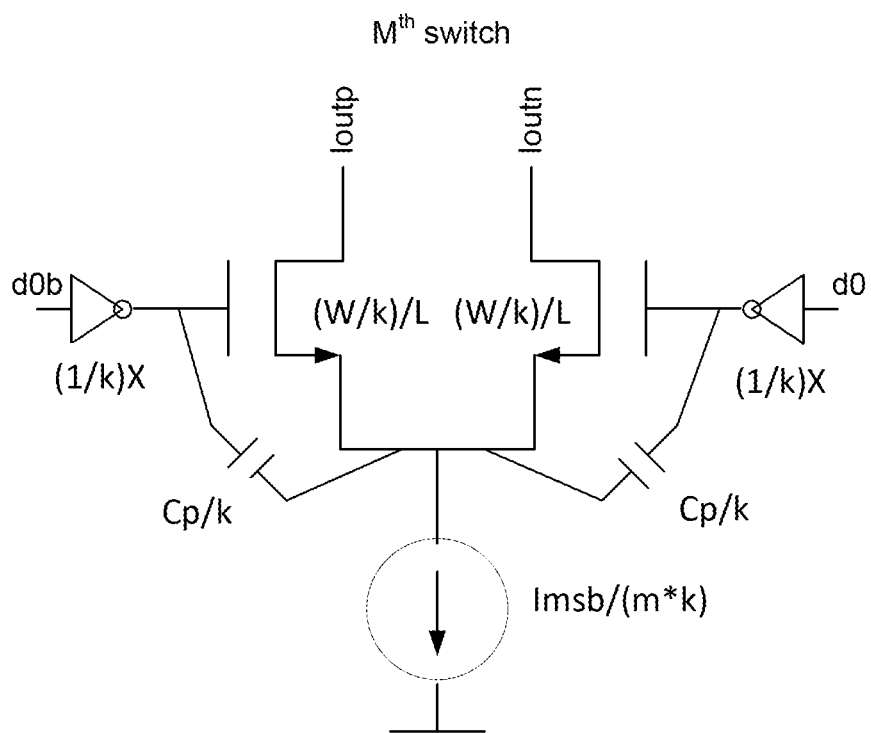

FIG. 3A-B show scaled and unscaled current steering switches illustrating a "break" In scaling. Specifically, these figures illustrate how switches become "unscaled" relative to the current provided by the switch where the ratio of the size of the unscaled switch to the current provided by the unscaled switch no longer follows the ratio set by the larger or largest scaled switch. Not shown is the MSB switch (or the larger/largest switch of the DAC). The MSB switch is similar to the scenario where scaling does not break (FIGS. 2A-B), and carries the largest amount of current Imsb and consequently has the largest size. The MSB switch (i.e., the transistor) has a size W/L; the switch driver has a size of 1X; the parasitics has size of Cp. This MSB switch (or the larger/largest switch of the DAC) sets the ratio between the size of the switch and the current being driven by the switch for proper scaling.

In FIG. 3A, the Kth current switch is similar to the scenario in FIGS. 2A-B, where scaling occurs properly and according to the ratio set by the MSB switch. However, in this scenario in FIGS. 3A-B, the Kth current switch is the last switch to be properly scaled relative to the current provided by the current steering switch according to the ratio set by the MSB switch. As shown in FIG. 3A, the Kth switch is scaled according to the current provided by the switch Imsb/k. The Kth switch (i.e., the transistor) has a size (W/k)/L; the switch driver has a size (1/k)X; the parasitics has a size of Cp/k. After the Kth switch, the current steering switch(es) for generating smaller currents can no longer be practically scaled down.

In FIG. 3B, the Mth and subsequently smaller switches have the same size devices (W/k)/L and parasitics (Cp/k) as the Kth switch, but much lower currents. The Mth switch is no longer scaled according to the current provided by the switch Imsb/(m*k). The switch (i.e., the transistor) has a size (W/k)/L; the switch driver has a size (1/k)X; the parasitics has a size of Cp/k. For the Mth switch, scaling breaks because the scaling of the switch is no longer proportional to the current being provided by the switch according to the ratio set by the MSB switch. The size of the switch is too big (relative to the scaled switches of the DAC).

Within the context of this disclosure, k and m can be any positive real number, and the values for k and m can be selected based on the application and architecture such that the switch drives a desired amount of current.

Due to the unscaled loading of these switches (the Mth switch and any other switch providing the same amount or less amount of current as the Mth switch), the output charging currents imparted by these switches start to shift in time relative to the larger switch currents. Non-uniformity of the charging instant leads to both wideband noise for higher amplitude signals and high to moderate order harmonic distortions for lower amplitude signals. In either case, the added noise and/or distortion reduces the dynamic performance of the DAC.

Figure 4:
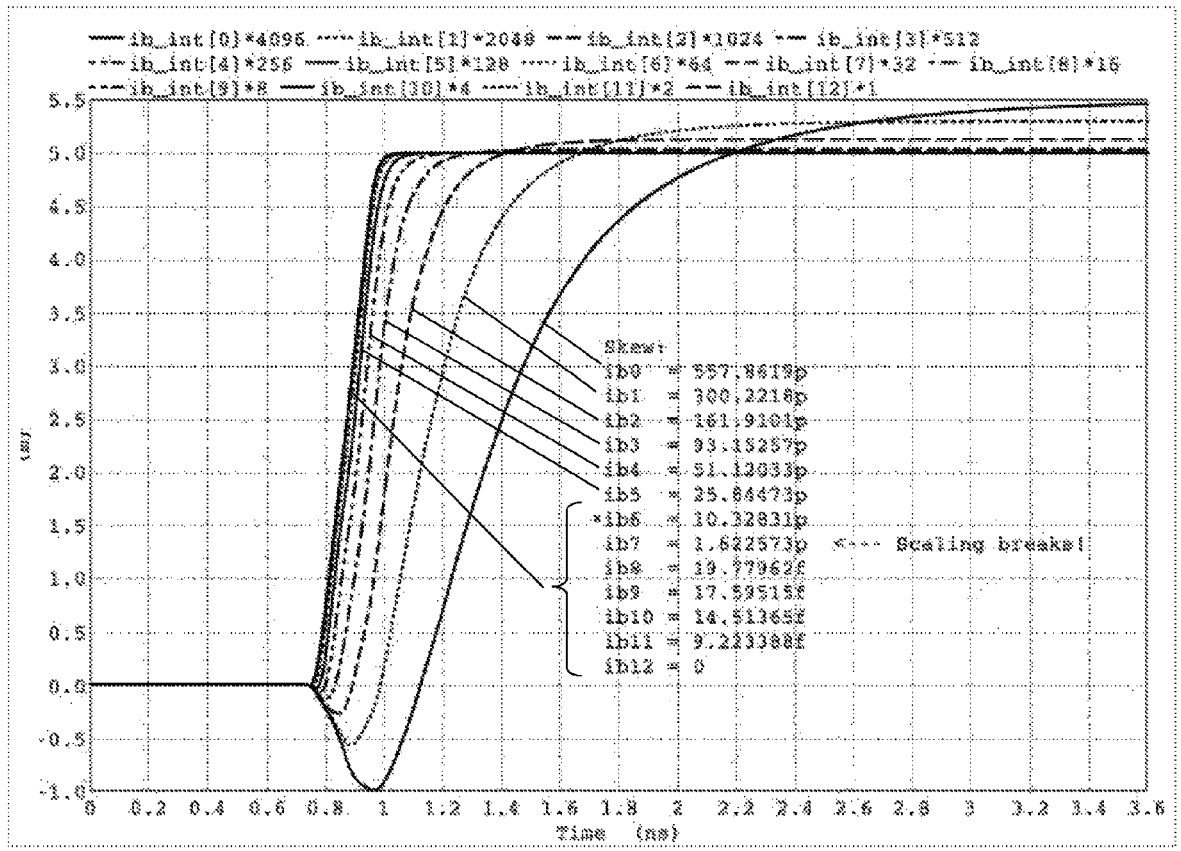
FIG. 4 shows normalized integrated charge timing for a single pulse of scaled and unscaled current steering switches.

FIG. 4 shows normalized integrated charge timing for a single pulse of least significant bit scaled and unscaled current steering switches. The curves are normalized where the integral is multiplied by a factor of $2^{(12-x)}$ for the Xth bit, ibX, for easier understanding. The graph shows the difference in charge delivery (measure of settling time) for several switches of a high speed current steering DAC, where ib12 corresponds to the largest current and ib0 corresponds to the smallest current. The "skew" shown on the graph is measured from ib12 as the reference. The skew is measured from the midpoint of the ib12 to the midpoint of the other curves. The skew illustrates relative error. The exemplary switches are make up a 13-bit DAC. The curve for ib0 is the curve which bends to the right the most, and the curve for ib1 is the curve to the left of the line for ib0, and so on up to ib6. The curves for ib7-ib12 have very little difference and thus overlap and form the left most curve on the graph. The settling time (or timing error) is measured from ib12 being the reference.

Notice that timing differences to the curve labeled ib12 are very small until which point the "scaling breaks". This is because the current and switch size/parasitic are scaled according to a ratio set by the larger/largest switches, i.e. ib11 current is ½ that of ib12 and all circuits are ½ the size and likewise for ib10 relative to ib11. Note that when the scaling breaks the halfway point of the charge transfer between ib12 and ib7 (where scaling is no longer according to the ratio) has shifted by 2 orders of magnitude relative to the prior shift between ib12 and ib8. The shift between ib12 and ib6 on the other hand is another order of magnitude larger. If one looks at the effective shift on the very smallest LSBs, with high sample rate DACs, currents typically don't even make it to full switching until many samples after the initial change. This amount of shift effectively reduces the resolution of the converter. Beyond the point the scaling breaks, something must be done to fix the timing issues associated with the break.

Complementary Current Steering Switches

If it is possible to design a DAC which breaks the scaling of the current sources only to the very first element broken, say ib7 in FIG. 4, then timing can be reasonably maintained. This can be done by introducing complementary switches. The idea of complementary switches involves generating two different (larger) currents using two pairs of switches. The two pairs of switches are cross-coupled and reversed in polarity. As a result, the current output combining the outputs from the two pairs of switches results in a smaller current (i.e., the difference between the two different (larger) currents). This use of the complementary switches as the current steering switching element provides a smaller current without having to always scale down proportionally to the smaller current because the pairs of switches themselves are actually providing a bigger current. Therefore, even when the switching elements need to provide a smaller and smaller current, the pairs of switches may be scaled according to the ratio, and in some cases, only slightly off from the desired ratio. For that reason, the settling timing error caused by the inability to scale down the switches according to the ratio is alleviated by means of using the two pairs of switches providing two different (larger) currents to generate the smaller current.

Figure 5A:
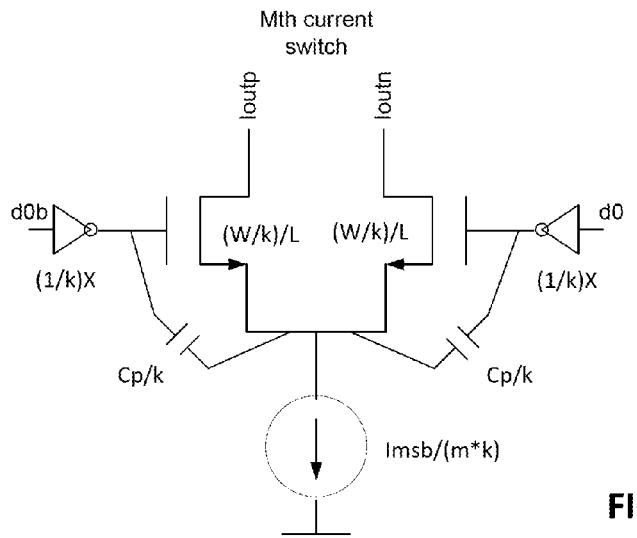
FIG. 5A shows a Mth unscaled current steering switch.
Figure 5B:
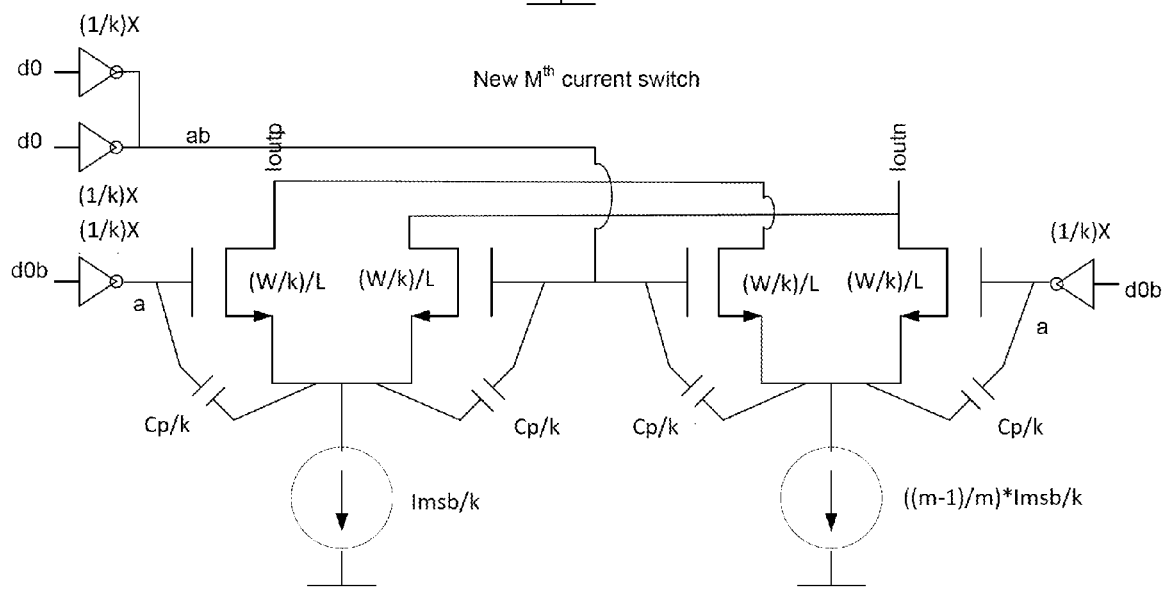
FIG. 5B shows an improved Mth switch comprising complementary current steering switches, according to some embodiments of the disclosure.

FIG. 5A shows an Mth unscaled current steering switches where the scaling cannot be provided according to the ratio set by the larger/largest switch of the DAC. This is similar to the Mth switch shown in FIG. 3B. For illustration, this is juxtaposed with the improved current steering switches of FIG. 5B. FIG. 5B shows an improved Mth switching element comprising complementary current steering switches, according to some embodiments of the disclosure. In a current steering DAC, each pair of switches will route all of its current to one of the two output nets (current combining networks) of the DAC, Ioutp or Ioutn.

The following illustrates the concept of a normalized scaling factor. Within the context of this disclosure, current steering switching elements which are scaled according to the ratio is considered to have a "normalized scaling factor" (NSF) of 1. In timing graph of FIG. 4 showing binary weighted switches, the switch on which the scaling breaks would have an NSF=½. This ½ NSF leads to a settling error of 1.6 pS at ib7. The next switch, ib6, has an NSF of ¼ and a settling timing error of 10 pS.

In order to reduce the settling timing error of ib6, it can be replaced with two pairs of switches, i.e., complementary current steering switches. The first pair of switches will have NSF=1. The current for this complementary current steering switches with be steered to Ioutp if the digital input signal, d0 is 1 and Ioutn if the d0 is 0. The second pair of switches will have an NSF of ¾ and its output will be steered to Ioutn if d0 is 1 and Ioutp if the d0 is 0. As the two pairs of switches are reversed in polarity from one another, the total differential current presented to the output is only ¼ that of ib8 or that imparted by the original ib6. This combination has two pairs of switches with NSF >½ and therefore a settling timing error between 0 and 1.6 pS. The timing error is actually better than ib7. Generalizing this trend, $i_p$ can be replaced with two pairs of switches: one with NSF=1 and one with NSF=(p-1)/p, where p is any positive real number, to give a 1/p x effective current provided by the switch before scaling breaks with progressively better timing error for greater values of p. In other words, smaller currents can be provided without scaling and the timing error suffered by an equivalent unscaled switch providing the same current observed at the differential output of the complementary switches. At the limit (p→∞), $i_p$ will have two pairs of switches, NSF=1 and NSF~1, and timing effectively equivalent to the switch just before the scaling breaks.

The improved "$M^{th}$ current switch" shows complementary switches having two pairs of differential current steering switches. The first pair of switches (left) steers a current Imsb/k. The pair of switches has a size (W/k)/L; the parasitics have a size Cp/k; the digital driver has a size (1/k)X, where the scaling is according to the ratio set by the scaled switches of the DAC. The second pair of switches (right) steers a current ((m−1)/m)*Imsb/k. The switch has a size (W/k)/L; the parasitics have a size Cp/k; the digital driver has a size (1/k)X, where the scaling is not according to the ratio, but is relatively close to the ratio.

Note that the original pair of switches directs Imsb/(k*m) to the Ioutp and 0 to Ioutn if d0 is high, or Imsb/(k*m) to Ioutn and 0 to Ioutp if d0b is high. In this case, the differential current of the pair of switches is Imsb/(k*m). The old switching element in FIG. 5A pairs differential current is either Imsb/(k*m) or −Imsb/(k*m). The new switching element comprising complementary switches having reversed polarity in FIG. 5B directs Imsb/k to Ioutp and (m−1)Imsb/(k*m) to Ioutn if d0 is high, or Imsb/k to Ioutn and (m−1)*Imsb/(k*m) to Ioutp if d0b is high. The difference between Ioutn and Ioutp is still either Imsb/(k*m) or −Imsb/(k*m), thus providing an equivalent current steering switch using two pairs of current steering switches. This equivalent switching element suffers less timing error when compared to the unscaled current steering switch (the original Mth switching element of FIG. 3B) providing the same current at the differential output pair Ioutp and Ioutn.

However, there is now a common-mode current for the improved Mth switch. This common-mode current will not be significant and can be absorbed via AC coupling inductor (or component performing the same function) at the DAC output. Note that in addition to two switches producing the current of one, the two switches must each be driven with 1/k strength inverters (having the strength of the inverter driving the smallest scaled switch of the DAC, i.e., the Kth switching element) to maintain launch timing for the current. These drivers may be merged into one 2/k strength buffer (having twice the strength of the inverter driving the smallest scaled switch of the DAC, i.e., the Kth switching element) to match the drive to the load of the two new switches.

Figure 6:
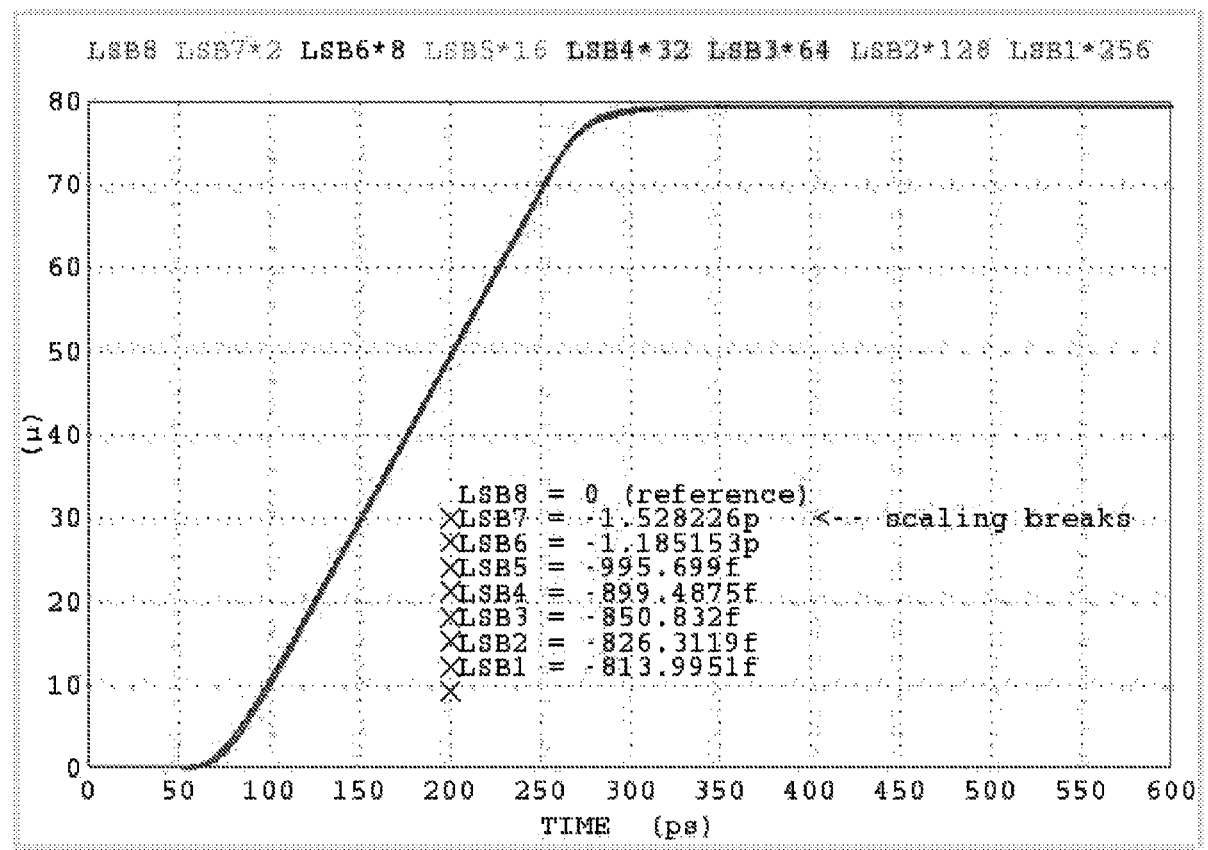
FIG. 6 shows normalized integrated charge timing for a scaled switch and improved current steering switches comprising complementary current steering switches, according to some embodiments of the disclosure.

FIG. 6 shows normalized integrated charge timing for a scaled switch and improved current steering switches comprising complementary current steering switches, according to some embodiments of the disclosure. The integral is multiplied by a factor corresponding to the LSB to produce a normalized plot. The new timing of the charge transfers for the complementary switches (measured using LSB8 as the reference) shows clearly that the complementary switches reduces the timing issues of unscaled switches. As seen in FIG. 6, the timing differences between LSB8-LSB1 are so small that the curves overlap each other. In this plot, the waveform called LSB8 is the last LSB before scaling breaks. Like in FIG. 4, the LSBs labeled are binarily scaled. Below the point at which scaling breaks, complementary switches are used instead of switches with broken scaling. Note that the timing difference between LSB8 and LSB[n] (n<8) is significantly smaller than that shown in FIG. 4. A practical design using this method can exist for mitigating timing errors amongst that switches of a current steering DAC.

Figure 7:
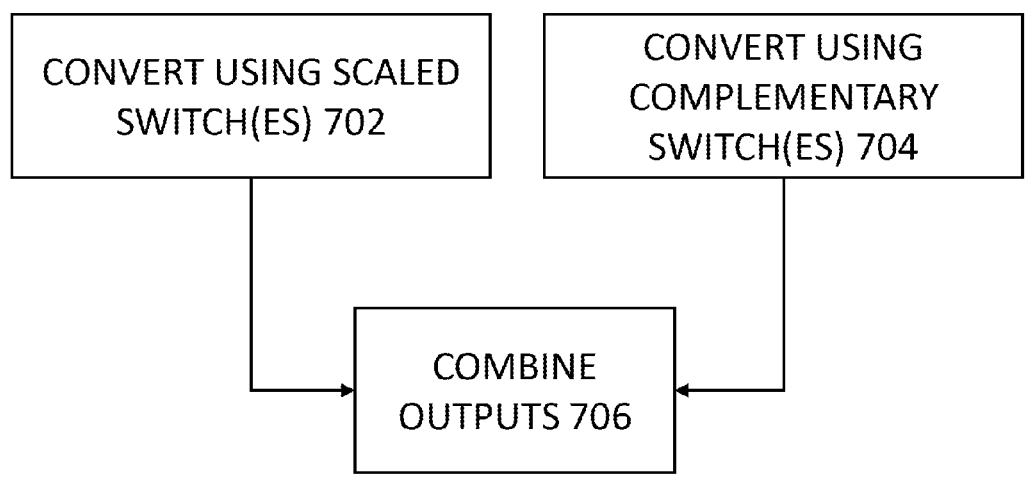
FIG. 7 shows an exemplary flow diagram illustrating method for reducing timing errors in a high speed current steering digital to analog converter, according to some embodiments of the disclosure.

FIG. 7 shows an exemplary flow diagram illustrating method for reducing timing errors in a high speed current steering digital to analog converter. Broadly, this method is applicable for converting a digital input signal into an analog output signal using a digital to analog converter as described using the complementary current steering switches shown in FIG. 5B. At box 702, an digital to analog converter converts a first part of the digital input signal to one or more current outputs using a first set of current steering switching element(s). The first set of current steering elements are configured to drive a set of different currents, and the first set of current steering elements are scaled proportionally to the current being provided by each of the first set of current steering switching element(s) according to a ratio between the size of a larger-sized switch in the digital to analog converter and a current provided by the larger-sized switch.

At box 704, the digital to analog converter converts a second part of the digital input signal to one or more current outputs using a second set of current steering switching element(s). The second set of current steering switching elements is configured to drive less current (than the currents in the set of different currents driven by the first set of current steering elements) without always scaling (the switches of the current switching elements) proportionally to current(s) provided in each of the second set of current steering switching elements according to the ratio, and each of the second set of current steering switching elements comprises complementary current steering switches for generating less current.

At box 706, the digital to analog converter combines the current outputs using a current combining network configured to combine the plurality of current outputs of the plurality of current steering switching elements to provide the analog output signal.

In the discussions of the embodiments above, the capacitors, clocks, DFFs, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure. In particular, the embodiments herein (e.g., using n-MOSFET transistors (NMOS)) can be easily extended to the case in which one or more of the current sources and the switches are p-MOSFET (PMOS) transistors. In some cases, it can be extended to the case in which both or one of the sources and switches are bipolar or heterojunction (such as GaAs or GaN) transistors. In such cases the scaling breaks much sooner than in the PMOS and NMOS cases and therefore the concept of handling breaking in scaling is just as relevant or possibly more relevant.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chipmodule (MCM), with a plurality of separate ICs located within a single electronic package and configured to interact closely with each other through the electronic package. In various other embodiments, the amplification functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Applications of DACs Using Complementary Current Steering Switches

Current steering Digital to Analog Converters (DACs) are used in many applications. Many transmit applications require the presence of variable gain in the transmit path in order to either service multiple different transmission channels or adaptively adjust the environment or the channel load. Typically this has been done in the past with the use of variable gain amplifiers which either attenuate or gain a signal from the DAC output before presenting it to the channel. This allows the DAC to run at a constant output power close to its maximum output level in order to achieve the highest spurious-free dynamic range (SFDR) and lowest noise. DAC linearity profiles are not well behaved for lower output levels like analog amplifier components are and therefore the amplitudes driven by the DAC is typically limited a narrow range. In order to simplify the transmit chain, it is desirable to follow a DAC with a fixed gain driver block. This allows for a lower power and smaller solution. The variable gain amplifier is now traded off for a larger range of DAC drive amplitudes. The linearity of the DAC must now be good for this wider range of signal amplitudes.

Figure 8:
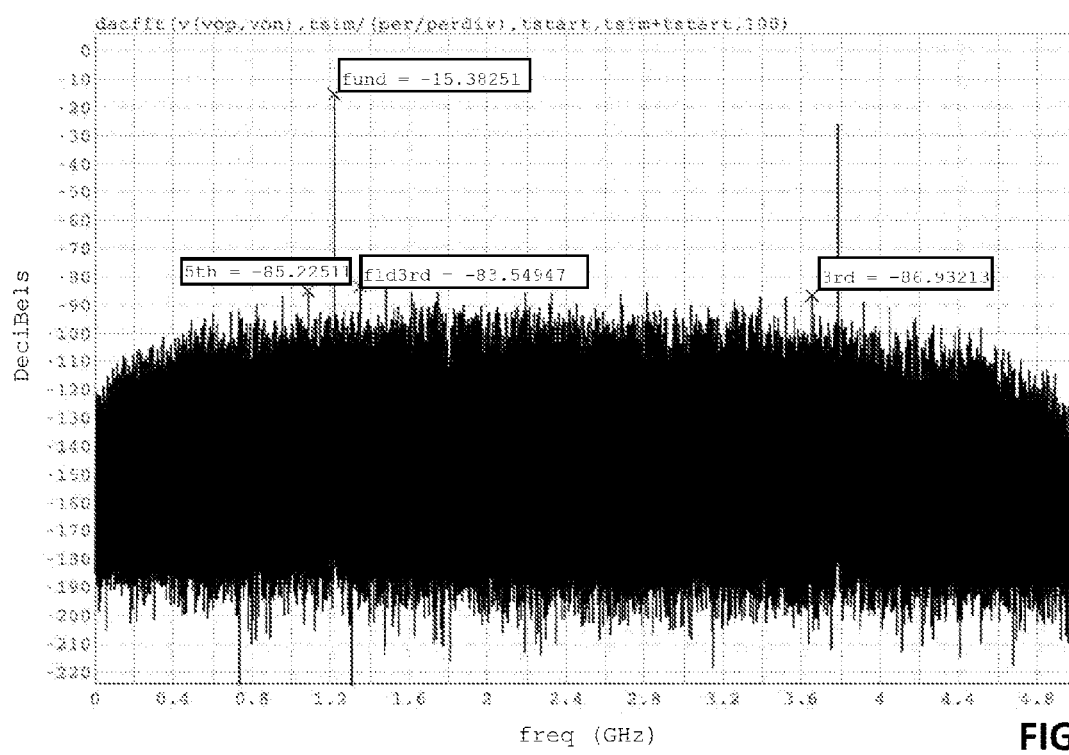
FIG. 8 illustrates noise and distortion produced by a DAC with unscaled LSB switches at low output amplitude.

DACs do not generally behave well for lower amplitude signal transmission unlike their analog amplifier counterparts. An amplifier may get more and more linear as amplitude decreases and the only issue becomes noise. A DAC, on the other hand, would become more linear with reduced amplitude only to a point. That point is where the current and timing errors imparted by the DAC segments swamps the well-controlled linearity improvement provided by the analog switch elements. In order to get the highest linearity DAC, the timing difference and current difference between all DAC elements must be ideally 0. As discussed in relation to FIG. 4, the LSBs will show significant timing shift relative to the MSBs of the DAC without the use of complementary current steering switches As FIG. 8 illustrates noise and distortion produced by a DAC with unscaled LSB switches at low output amplitude, and furthermore, shows the effects of LSB timing mismatch on a low amplitude signal from the DAC. This exemplary plot shows the output spectrum of a current steering DAC with unscaled LSBs (i.e., unscaled switches) driving an output signal 15 dB below its maximum output. The DAC has ideally matched currents so timing is the only issue present. The third and fifth order distortion components are measuring −68 dB and −75 dB relative to the carrier amplitude. The noise floor for this plot achieves a maximum of −85 dB relative to the carrier amplitude. The system using the DAC at this amplitude may not be able to achieve desired performance due to noise and distortion. All of these numbers would typically be better at higher amplitude. Thus, this DAC using unscaled switches does not have a good amplitude range.

Figure 9:
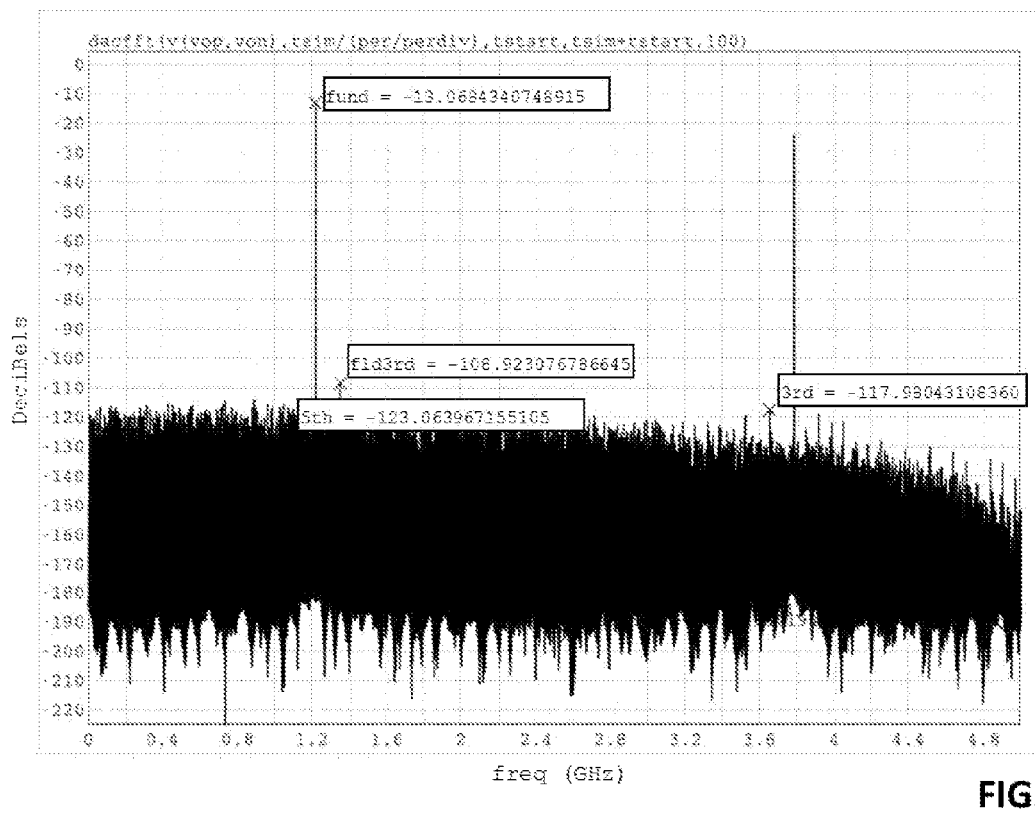
FIG. 9 illustrates noise and distortion produced by a DAC with complementary switches at low output amplitude.

FIG. 9 illustrates noise and distortion produced by a DAC with complementary switches at low output amplitude, which further shows the output spectrum of a similar DAC employing complementary current steering switches for the smallest current elements. The exemplary plot shows an output carrier amplitude of 13 dB below the maximum output amplitude of the converter and a third order distortion component at −95 dB below the carrier. This is an effective improvement in the distortion of around 28 dB. The noise has also been significantly improved, decreasing by a full 20 dB. By using the complementary current steering switches, the LSBs would not show significant timing shift relative to the MSBs of the DAC (as discussed in relation to FIG. 6). By reducing the timing error, the DAC is able to perform better.

Note that the activities discussed above with reference to the FIGURES are applicable to any integrated circuits that involve signal processing, particularly those that can execute specialized software programs, or algorithms, some of which may be associated with processing digitized real-time data. Certain embodiments can relate to multi-DSP signal processing, floating point processing, signal/control processing, fixed-function processing, microcontroller applications, etc.

In certain contexts, the features discussed herein can be applicable to medical systems, scientific instrumentation, wireless and wired communications, radar, industrial process control, audio and video equipment, instrumentation (which can be highly precise), and other digital-processing-based systems requiring a digital to analog converter.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

It is also important to note that the steps in the preceding flow diagram of FIG. 7 illustrate only some of the possible scenarios and patterns that may be executed by, or within, a DAC shown in the figures/drawings included herein. Some of these steps may be deleted or removed where appropriate, or these steps may be modified or changed considerably without departing from the scope of the present disclosure. In addition, a number of these operations have been described as being executed concurrently with, or in parallel to, one or more additional operations. However, the timing of these operations may be altered considerably. The preceding operational flows have been offered for purposes of example and discussion. Substantial flexibility is provided by communication systems shown in the figures/drawings in that any suitable arrangements, chronologies, configurations, and timing mechanisms may be provided without departing from the teachings of the present disclosure.

OTHER NOTES, EXAMPLES, AND IMPLEMENTATIONS

Note that all optional features of the apparatus described above may also be implemented with respect to the method or process described herein and specifics in the examples may be used anywhere in one or more embodiments.

In a first example, a system is provided (that can include any suitable circuitry, dividers, capacitors, resistors, inductors, ADCs, DFFs, logic gates, software, hardware, links, etc.) that can be part of any type of computer, which can further include a circuit board coupled to a plurality of electronic components. The system can include means for clocking data from the digital core onto a first data output of a macro using a first clock, the first clock being a macro clock; means for clocking the data from the first data output of the macro into the physical interface using a second clock, the second clock being a physical interface clock; means for clocking a first reset signal from the digital core onto a reset output of the macro using the macro clock, the first reset signal output used as a second reset signal; means for sampling the second reset signal using a third clock, which provides a clock rate greater than the rate of the second clock, to generate a sampled reset signal; and means for resetting the second clock to a predetermined state in the physical interface in response to a transition of the sampled reset signal.

The 'means for' in these instances (above) can include (but is not limited to) using any suitable component discussed herein, along with any suitable software, circuitry, hub, computer code, logic, algorithms, hardware, controller, interface, link, bus, communication pathway, etc. In a second example, the system includes memory that further comprises machine-readable instructions that when executed cause the system to perform any of the activities discussed above.

What is claimed is:

1. Complementary current steering switches for converting a digital input signal to a differential analog current output pair, the current steering complementary switches comprising:
    a first pair of switches configured to receive the digital input signal and steer a first differential current to the differential analog current output pair based on the digital input signal; and
    a second pair of switches of the same device type as the first pair of switches configured to receive the digital input signal and steer a second differential current to the differential analog current output pair based on the digital input signal;
    wherein:
        the first differential current is greater than the second differential current;
        the first pair of switches and the second pair of switches are reversed in polarity; and
        a third differential current at the differential analog current output pair is the difference between the first differential current and the second differential current.

2. The complementary current steering switches of claim 1, wherein
    the first pair of switches is scaled proportionally to the first current provided by the first switch according to a ratio between the size of a larger-sized switch and a current provided by the larger-sized switch; and
    the second pair of switches is not scaled proportionally to the second current provided by the second switch according to the ratio.

3. The complementary current steering switches of claim 2, wherein:
    the first pair of switches scaled according to the ratio has a normalized scaling factor of 1; and
    the second pair of switches not scaled according to the ratio is scaled according to a normalized scaling factor of (p−1)/p relative to the first pair of switches, where p is a positive real number.

4. The complementary current steering switches of claim 1, wherein the third differential current is smaller than the first differential current and is also smaller than the second differential current.

5. The complementary current steering switches of claim 3, wherein a settling timing error of the first pair of switches and the second pair of switches is less than the settling timing error of a single pair of current steering switches having a normalized scaling factor of 1/p.

6. The complementary current steering switches of claim 3, wherein a settling timing error of the first pair of switches and the second pair of switches decreases as p increases, and the settling timing error of the first pair of switches and the second pair of switches approaches a settling timing error of a single pair of current steering switches scaled according to a normalized scaling factor of 1.

7. The complementary current steering switches of claim 1, wherein:
    if the digital input signal is high, the first pair of switches routes the first current to a first one of the differential analog current output pair, and the second pair of switches routes a second current to the second one of the differential analog current output pair; and
    if the digital input signal is low, the first pair of switches routes the first current to the second one of the differential analog current output pair, and the second pair of switches routes the second current to the first one of the differential analog current output pair.

8. A digital to analog converter for converting a digital input signal into an analog output signal, comprising:
- a plurality of current steering switching elements for converting one or more parts of a digital input signal to a plurality of current outputs, the plurality of steering switching components comprising:
  - a first set of current steering switching element(s), wherein the first set of current steering elements are configured to drive different currents, and the first set of current steering elements are scaled proportionally to the current being provided by each of the first set of current steering switching element(s) according to a ratio between the size of a larger-sized switching element in the digital to analog converter and a current provided by the larger-sized switching element, and
  - a second set of current steering switching element(s), wherein the second set of current steering switching elements is configured to drive less current than the current provided by each of the first set of current steering switching element(s) without always scaling proportionally to current(s) provided in each of the second set of current steering switching elements according to the ratio, and each of the second set of current steering switching elements comprises complementary current steering switches; and
- a current combining network for combining the plurality of current outputs of the plurality of current steering switching elements to provide the analog output signal.

9. The digital to analog converter of claim 8, wherein:
complementary current steering switches for providing a differential output pair used in the second set of current steering switching elements comprises:
- a first pair of switches configured to receive the digital input signal and steer a first differential current to the differential analog current output pair based on the digital input signal; and
- a second pair of switches configured to receive the digital input signal and steer a second differential current to the differential analog current output pair based on the digital input signal;

wherein:
- the first differential current is greater than the second differential current;
- the first pair of switches and the second pair of switches are reversed in polarity; and
- a third differential current at the differential analog current output pair is the difference between the first differential current and the second differential current.

10. The digital to analog converter of claim 9, wherein:
the first pair of switches of the complimentary current steering switches scaled according to the ratio and each of the first set of current steering switching elements scaled according to the ratio have a normalized scaling factor of 1; and
the second pair of switches not scaled according to the ratio is scaled according to a normalized scaling factor of $(p-1)/p$ relative to the first pair of switches, where p is a positive real number.

11. The digital to analog converter of claim 10, wherein:
a settling timing error of complementary current steering switches comprising the first pair of switches and the second pair of switches is less than the settling timing error of a single current steering switch having a normalized scaling factor of $1/p$.

12. The digital to analog converter of claim 10, wherein:
a settling timing error of complimentary currents steering switches comprising the first pair of switches and the second pair of switches decreases as p increases, and the settling timing error of the first switch and the second switch approaches a settling timing error of the current steering switching element(s) in the first set of current steering switching element(s).

13. The digital to analog converter of claim 9, wherein:
a smallest current steering switching element in the first set of current steering switching elements is configured to output a differential current of $Imsb/k$, wherein $Imsb$ is the current steered by the current steering switching element providing by the larger-sized switch, and k is any positive real number; and
the complementary current steering switches are configured to output a differential current of $Imsb/(k*m)$, where m is any positive real number, by steering a first current $Imsb/k$ to a first one of the differential analog current output pair using the first pair of switches, and is configured to steer a second current $(m-1)*Imsb/(k*m)$ to a second one of the differential analog current output pair using a second pair of switches.

14. The digital to analog converter of claim 8, wherein a common-mode current from each of the second set of current steering switching elements is absorbed using an alternating current coupling component at an output of the digital to analog converter.

15. The digital to analog converter of claim 9, wherein the first pair of switches and the second pair of switches are individually driven with an inverter having the same strength as the inverter driving the smallest current steering switching element in the first set of current steering switching element(s).

16. The digital to analog converter of claim 9, wherein the first pair of switches and the second pair of switches are driven together with an inverter having twice the strength as the inverter driving the smallest current steering switching element in the first set of current steering switching element(s).

17. The digital to analog converter of claim 9, wherein:
the third differential current of the differential analog current output pair effectively corresponds to a current provided by a single pair of switches for steering the same amount of current.

18. A method for converting a digital input signal into an analog output signal using a digital to analog converter, comprising:
converting a first part of the digital input signal to one or more current outputs using a first set of current steering switching element(s), wherein the first set of current steering elements are configured to drive a set of different currents, and the first set of current steering elements are scaled proportionally to the current being provided by each of the first set of current steering switching element(s) according to a ratio between the size of a larger-sized switch in the digital to analog converter and a current provided by the larger-sized switch, and
converting a second part of the digital input signal to one or more current outputs using a second set of current steering switching element(s), wherein the second set of current steering switching elements is configured to drive less current than the currents in the set of different currents driven by the first set of current steering elements without always scaling proportionally to current(s) provided in each of the second set of current steering switching elements according to the ratio, and each of the second set of current steering switching elements comprises complementary current steering switches for generating less current; and combining the current outputs using a current combining network configured to combine the plurality of current outputs of the plurality of current steering switching elements to provide the analog output signal.

19. The method of claim 18, wherein:

the complementary current steering switches used in the second set of current steering switching elements comprises:
- a first pair of switches configured to receive the digital input signal and steer a first differential current to the differential analog current output pair based on the digital input signal; and
- a second pair of switches configured to receive the digital input signal and steer a second differential current to the differential analog current output pair based on the digital input signal;

wherein:
- the first differential current is greater than the second differential current;
- the first pair of switches and the second pair of switches are reversed in polarity; and
- a third differential current at the differential analog current output pair is smaller than the first differential current and is also smaller than the second differential current.

20. The method of claim 19, wherein:

the first pair of switches of the complimentary current steering switches scaled according to the ratio and each of the first set of current steering switching elements scaled according to the ratio has a normalized scaling factor of 1; and the second pair of switches not scaled according to the ratio is scaled according to a normalized scaling factor of $(p-1)/p$ relative to the first pair of switches, where p is a positive real number.

21. The method of claim 20, wherein:

a settling timing error of complementary current steering switches comprising the first pair of switches and the second pair of switches is less than the settling timing error of a single current steering switch having a normalized scaling factor of $1/p$.

22. The method of claim 20, wherein:

a settling timing error of complimentary currents steering switches comprising the first pair of switches and the second pair of switches decreases as p increases, and the settling timing error of the first switch and the second switch approaches a settling timing error of the current steering switching element(s) in the first set of current steering switching element(s).

23. A method for converting a digital input signal to a differential analog current output pair by complementary current steering switches, comprising:

receiving, by a first pair of switches, the digital input signal;

steering by the first pair of switches a first differential current to the differential analog current output pair based on the digital input signal;

receiving, by a second pair of switches of the same device type as the first pair of switches the digital input signal, wherein the first pair of switches and the second pair of switches are reversed in polarity;

steering, by the second pair of switches a second differential current to the differential analog current output pair based on the digital input signal, wherein the first differential current is greater than the second differential current, and generating a third differential current at the differential analog current output pair, wherein the third differential current is the difference between the first differential current and the second differential current.

24. The method of claim 23, wherein:

the first pair of switches scaled according to the ratio has a normalized scaling factor of 1; and the second pair of switches not scaled according to the ratio is scaled according to a normalized scaling factor of $(p-1)/p$ relative to the first pair of switches, where p is a positive real number.

25. The method of claim 24, wherein a settling timing error of the first pair of switches and the second pair of switches is less than the settling timing error of a single pair of current steering switches having a normalized scaling factor of $1/p$.

26. The method of claim 24, wherein a settling timing error of the first pair of switches and the second pair of switches decreases as p increases, and the settling timing error of the first pair of switches and the second pair of switches approaches a settling timing error of a single pair of current steering switches scaled according to a normalized scaling factor of 1.

27. The method of claim 23, further comprising:

if the digital input signal is high:
- routing, by the first pair of switches, the first current to a first one of the differential analog current output pair; and
- routing, by the second pair of switches, a second current to the second one of the differential analog current output pair; and if the digital input signal is low:
- routing, by the first pair of switches, the first current to the second one of the differential analog current output pair; and
- routing, by the second pair of switches, the second current to the first one of the differential analog current output pair.

* * * * *